United States Patent
Suzuki et al.

(10) Patent No.: US 9,640,337 B2
(45) Date of Patent: May 2, 2017

(54) VEHICLE WINDOW SWITCH MOUNTED WITHIN A DOOR RECESS

(71) Applicants: TOYOTA BOSHOKU KABUSHIKI KAISHA, Aichi-ken (JP); Sumitomo Riko Company Limited, Aichi-ken (JP); TOKAI CHEMICAL INDUSTRIES, LTD., Gifu-ken (JP)

(72) Inventors: Toshihiro Suzuki, Gamagoori (JP); Atushi Muramatu, Komaki (JP); Masanori Yamamoto, Kasugai (JP); Shoji Sanae, Inuyamashi (JP); Seiji Kobayashi, Kani (JP); Mari Azumi, Minokamo (JP)

(73) Assignees: TOYOTA BOSHOKU KABUSHIKI KAISHA, Aichi-Ken; SUMITOMO RIKO COMPANY LIMITED, Aichi-Ken; TOKAI CHEMICAL INDUSTRIES, LTD., Gifu-Ken ( * ) Notice: Subject to any disclaimer, the term of this patent is extended or adjusted under 35 U.S.C. 154(b) by 0 days.

(21) Appl. No.: 14/711,818

(22) Filed: May 14, 2015

(65) Prior Publication Data
US 2015/0340173 A1 Nov. 26, 2015

(30) Foreign Application Priority Data
May 26, 2014 (JP) .................................. 2014-108062

(51) Int. Cl.
| | | |
|---|---|---|
| *H01H 9/26* | (2006.01) | |
| *H01H 3/04* | (2006.01) | |
| *H01H 15/24* | (2006.01) | |
| *B60R 11/02* | (2006.01) | |
| *H01H 3/12* | (2006.01) | |
| *B60R 11/00* | (2006.01) | |

(52) U.S. Cl.
CPC ............... *H01H 3/04* (2013.01); *B60R 11/02* (2013.01); *B60R 11/0264* (2013.01); *H01H 3/12* (2013.01); *H01H 15/24* (2013.01); *B60R 2011/0021* (2013.01)

(58) Field of Classification Search
CPC .................................................. H01H 2300/01
USPC .......................... 200/335, 5 A, 5 R; 296/153
See application file for complete search history.

(56) References Cited

U.S. PATENT DOCUMENTS

| | | | |
|---|---|---|---|
| 6,746,067 B2 * | 6/2004 | Schmidt ................ | B60K 37/06 180/326 |
| 7,759,589 B2 * | 7/2010 | Gothlin ................. | H01H 15/24 200/18 |

(Continued)

FOREIGN PATENT DOCUMENTS

JP 2009-517282 4/2009

*Primary Examiner* — Vanessa Girardi
(74) *Attorney, Agent, or Firm* — Greenblum & Bernstein, P.L.C.

(57) ABSTRACT

A door window opening and closing switch assembly includes a vehicular door window closing switch that is a touch-sensitive sensor and for closing a vehicular door window, and a switch mount member where the vehicular door window closing switch is mounted, and the switch mount member includes a switch operation portion having an opening, an opening edge portion around the opening, and a side wall extending from the opening edge portion. The door window closing switch is mounted on the side wall.

13 Claims, 6 Drawing Sheets

(56) References Cited

U.S. PATENT DOCUMENTS

2005/0274452 A1* 12/2005 Schoemann ........ B29C 45/1676
156/245
2008/0297929 A1 12/2008 Reyss et al.

* cited by examiner

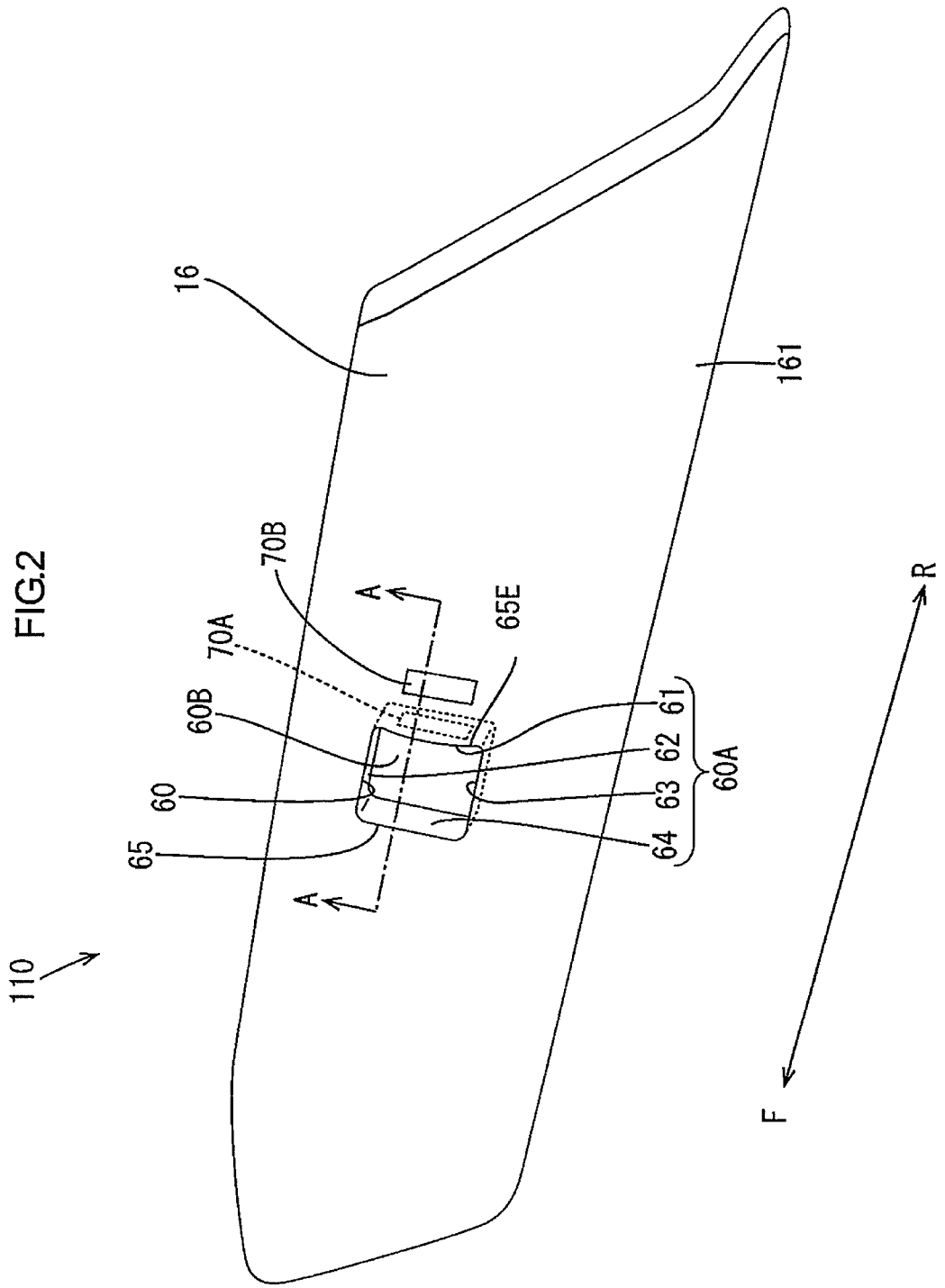

VEHICLE WINDOW SWITCH MOUNTED WITHIN A DOOR RECESS

CROSS REFERENCE TO RELATED APPLICATION

This application claims priority from Japanese Patent Application No. 2014-108062 filed May 26, 2014. The entire contents of the priority application are incorporated herein by reference.

FIELD OF THE INVENTION

The present disclosure relates to a door window opening and closing switch assembly, especially relates to a switch for opening and closing a vehicular door window.

BACKGROUND OF THE INVENTION

Switches for opening and closing a door window are arranged on a surface of a switch panel. One of the switches corresponding to a door window that is desired to be opened or closed is selected and operated by a driver or a passenger. Thus, the door window is opened or closed. In the configuration, the switches are arranged on the surface of the switch panel with uncovered so as to be easily operated by the driver or the passenger. In such a configuration, the driver or the passenger is likely to touch and operate the switches by mistake and the door window may be opened or closed unintentionally.

SUMMARY OF THE INVENTION

An objective of the present technology is to provide a door window opening and closing switch assembly having good operability and causing less wrong operations.

To solve the above problems, a door window opening and closing switch assembly according to the present technology includes a vehicular door window closing switch that is a touch-sensitive sensor and for closing a vehicular door window, and a switch mount member where the vehicular door window closing switch is mounted. The switch mount member includes a switch operation portion having an opening and an opening edge portion around the opening, and a side wall extending from the opening edge portion, and the door window closing switch is mounted on the side wall.

BRIEF DESCRIPTION OF THE DRAWINGS

FIG. 2 is a perspective view illustrating a switch mount member.

DETAILED DESCRIPTION OF EMBODIMENTS

In the configuration that the door window opening and closing switches are arranged on the surface of the switch panel with uncovered, the driver or the passenger is likely to touch and operate by mistake and the door window may be opened or closed unintentionally. The door window may be opened or closed in a following method to prevent occurrence of such a wrong operation. Another switch for closing the door window is provided in a separate position from the switch for opening and closing the door window. Two switches including the other switch for closing the door window and the switch for opening and closing the door window that are arranged in different positions are necessarily operated simultaneously to close the door window. However, with such a method, only when the two switches are simultaneously operated, the door window is closed. Therefore, such an operation is troublesome and not useful to close the door window while a driver is driving a vehicle. Further, a driver or a passenger is required to be familiar with the simultaneous operation of the two switches to close the door window smoothly, and this is troublesome.

Figure 1:
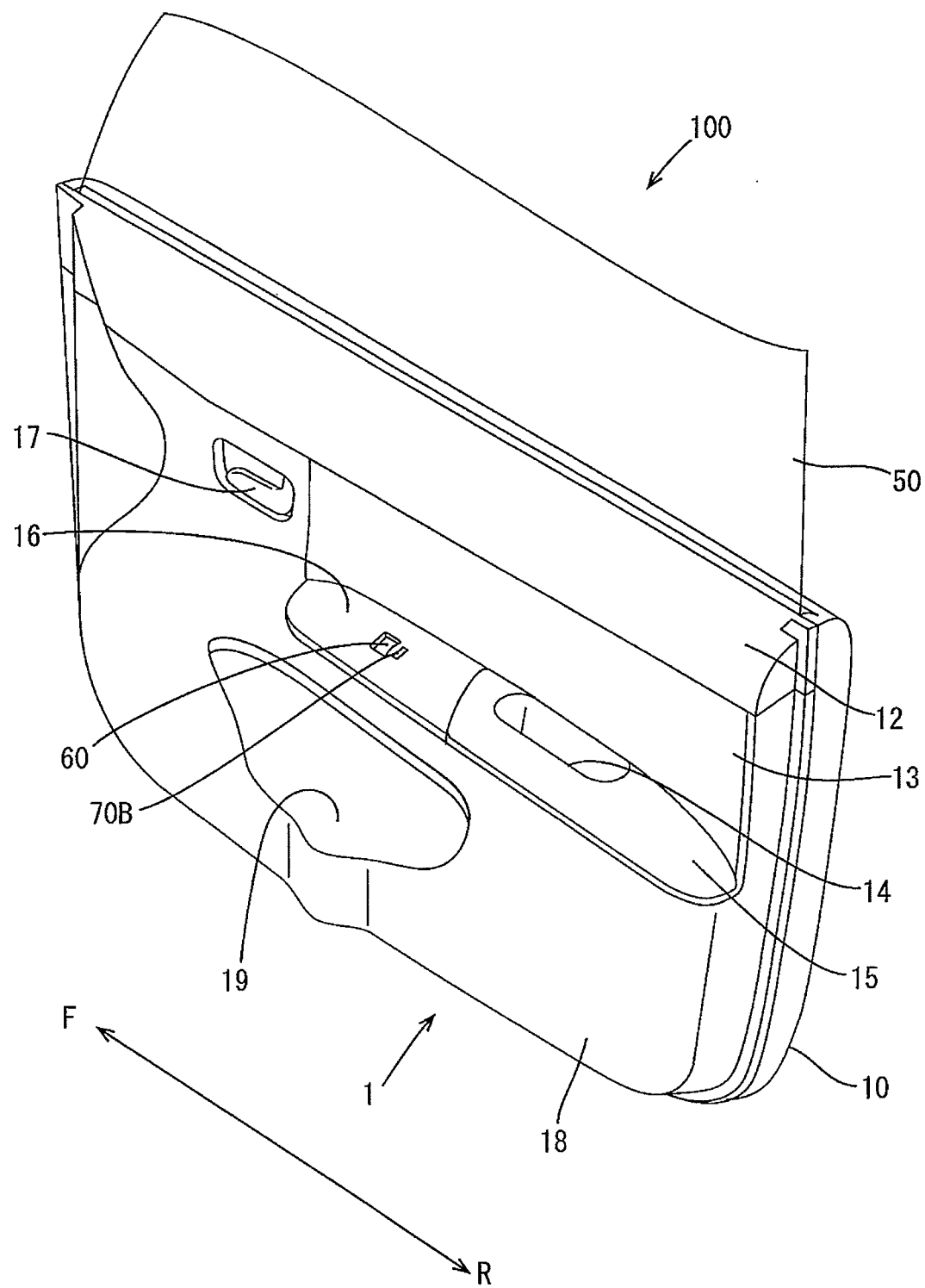
FIG. 1 is a perspective view illustrating a vehicular door.

A door window opening and closing switch assembly 110 according to a first embodiment of the present technology will be described with reference to FIGS. 1 to 5. FIG. 1 is a perspective view illustrating a vehicular door 100 including the door window opening and closing switch assembly 110 according to this embodiment. In FIGS. 1, 2, and 4, an upper-left side is a vehicular front side F and a lower-right side is a vehicular rear side R. The vehicular door 100 includes a vehicular door panel 10 and a vehicular interior part 1 that is provided on a vehicular interior side of the vehicular door panel 10. The vehicular interior part 1 includes an upper board 12, a lower board 18, and an ornament 13. The upper board 12 has a belt-like shape extending in a vehicular front-and-rear direction at an upper edge portion of the interior part 1. The lower board 18 is provided as a lower portion of the interior part 1, and the ornament 13 is provided between the upper board 12 and the lower board 18. An armrest 15 is provided between the ornament 13 and the lower board 18. The armrest 15 includes a pull-handle box 14 that is open upward so that a driver or a passenger puts his/her hand therein to open or close the vehicular door 100 from the vehicular interior side. A switch mount member 16 is provided on a vehicular front side with respect to the armrest 15 and switches for opening and closing a door window 50 are arranged in the switch mount member 16. The switch mount member 16 is provided continuously from the armrest 15 and also has a function of an armrest. An inner handle 17 is arranged on an upper side and a vehicular front side with respect to the switch mount member 16. The vehicular door 100 is unlocked and opened with the inner handle 17 from the vehicular interior side. The lower board 18 includes a door pocket 19 in a substantially middle portion thereof that is on a lower side with respect to the armrest 15 and the switch mount member 16.

Figure 3A:
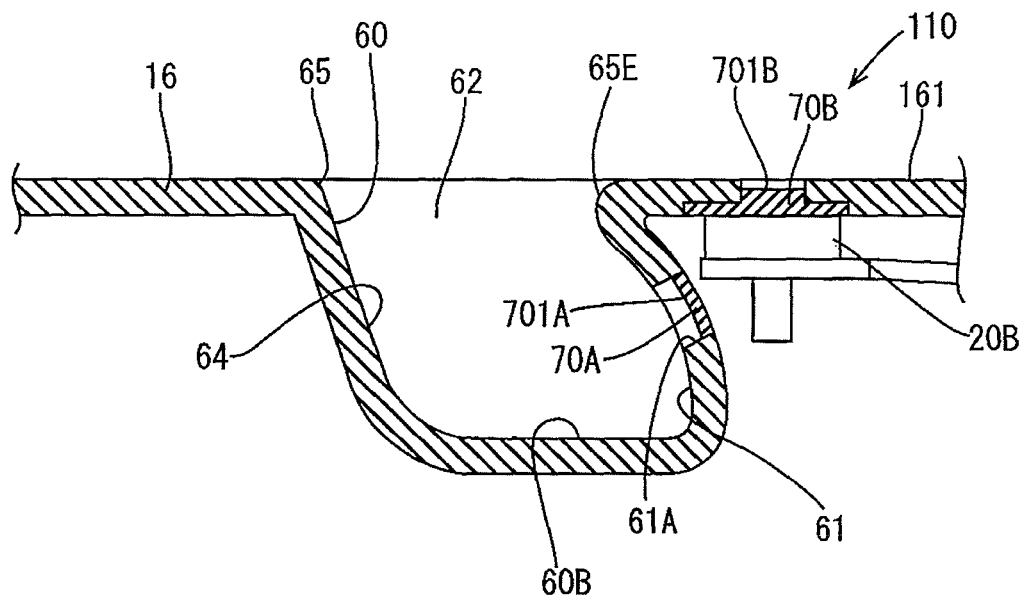
FIG. 3A is a cross-sectional view of a door window opening and closing switch assembly taken along line A-A in FIG. 2 according to a first embodiment.
Figure 4:
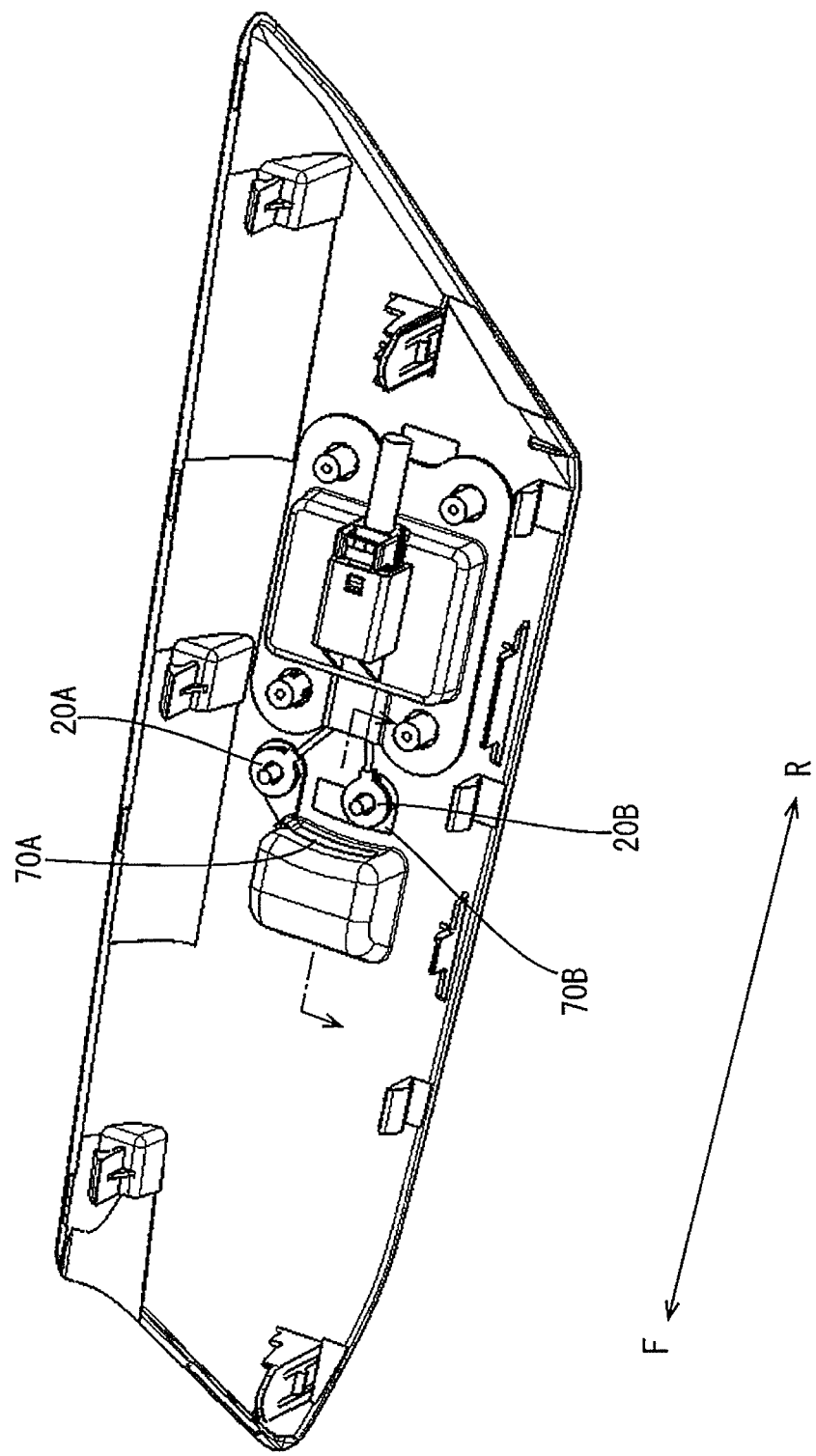
FIG. 4 is a rear view of the switch mount member in FIG. 2.

As illustrated in FIGS. 2 and 3A, the door window opening and closing switch assembly 110 according to this embodiment includes the switch mount member 16, a switch operation recess 60 that is a switch operation portion provided in the switch mount member 16, and switches arranged in the switch mount member 16. The switch mount member 16 includes a main surface portion 161 and the switch operation recess 60 that is the switch operation portion. The switch operation recess 60 is in a substantially middle portion of the main surface (upper surface) portion 161 of the switch mount member 16 so as to open upwardly. The switch operation recess 60 has an opening that has a substantially square shape and is defined by an opening edge portion 65 of the main surface portion 161. The switch operation recess 60 has an opening dimension and a depth so that a driver or a passenger can insert his/her finger therein. Accordingly, the driver or the passenger easily inserts his/her finger into the switch operation recess 60 through the opening. The switch operation recess 60 includes side walls 60A and a bottom portion 60B, and the side walls 60A include a front wall 64, a vehicular interior side wall 63, a vehicular exterior side wall 62, and a rear wall 61. Each of the side walls 60A extends downwardly from the opening edge portion 65 of the opening. The bottom portion 60B is arranged at the extended ends of the side walls 60A. As illustrated in FIG. 3A, the front wall 64, the vehicular interior side wall 63, the vehicular exterior side wall 62, the rear wall 61, and the bottom portion 60B included in the switch operation recess 60 have a substantially same thickness as that of the main surface portion 161 of the switch mount member 16. If something falls in the recess, it is received by the bottom portion 60B and does not falls in a space outside the interior part. The side walls 60A, the main surface portion 161, and the bottom portion 60B having a substantially same thickness are easily formed.

The switch operation recess 60 is in a substantially middle portion of the main surface (upper surface) portion 161 of the switch mount member 16 in FIG. 2. However, the switch operation recess 60 may be in any other portion of the main surface (upper surface) portion 161 such as a vehicular front-side portion, a vehicular rear-side portion, a vehicular interior-side portion with respect to a vehicular width direction, and a vehicular exterior-side portion with respect to the vehicular width direction. The opening of the switch operation recess 60 is substantially square in FIG. 2. However, the switch operation recess 60 may have a substantially rectangular opening or a substantially semicircular opening as long as it has an opening size and a depth so that a driver or a passenger can insert his/her finger therein. Further, the switch operation recess 60 may have a depth so that a long-nailed person or a person with fake nails can insert his/her finger therein.

Figure 3B:
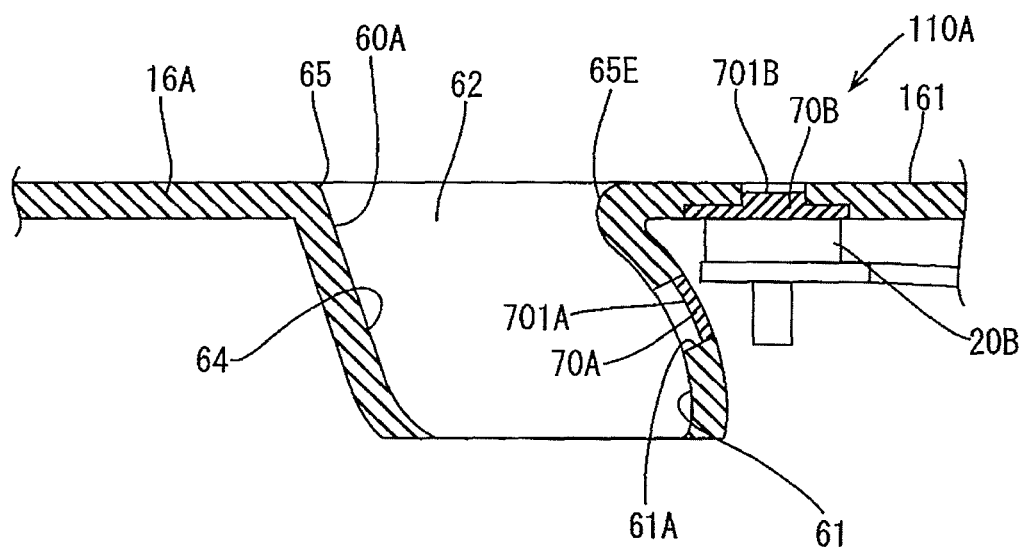
FIG. 3B is a cross-sectional view of a switch mount member according to a modification of the first embodiment

If a mechanical-type switch is used for opening and closing the door window, a switch mechanism is required to be arranged below the mechanical-type switch that is an operation portion. However, a touch-sensitive switch, which will be described later, is used in the present embodiment and therefore, the switch mechanism is not required to be arranged below the bottom portion 60B of the switch operation recess 60. Further, the switch operation recess 60 may not include the bottom portion 60B and the switch operation recess 60 may be formed in a through hole. As illustrated in FIG. 3B, according to a modification of the first embodiment, a window opening and closing switch assembly 110A includes a switch mount member 16A that has a switch operation through hole 60A instead of the switch operation recess 60. According to such a configuration, a person with long nails can easily operate the switch. Further, a space below the switch operation through hole 60A may be used freely and this provides free design choice. In this modification, the configuration of the window opening and closing switch assembly 110A differs from that of the first embodiment in that the switch operation through hole 60A is formed instead of the switch operation recess 60, and other configurations are same as those in the first embodiment.

The switches for opening and closing the door window 50 include a closing switch 70A and an opening switch 70B. The closing switch 70A that is used for closing the door window 50 is a touch-sensitive sensor made of conductive resin. The closing switch 70A is arranged in a substantially middle portion of the rear wall 61 of the side wall 60A and has a substantially rectangular shape elongated in a vehicular width direction. The closing switch 70A is arranged on the side wall 60A of the switch operation recess 60. Therefore, if a driver or a passenger puts his/her arm or hand on the main surface (upper surface) portion 161 of the switch mount member 16, he/she may not touch the closing switch 70A unintentionally or by accident. Namely, unless the driver or the passenger inserts his/her finger into the switch operation recess 60, he/she may not touch the closing switch 70A by accident and may be less likely to close the door window 50 unintentionally. Accordingly, such wrong operations are less likely to occur. The driver or the passenger touches a switch surface 701A of the closing switch 70A that is arranged on the rear wall 61 with his/her finger to operate the closing switch 70A. Such an operation is similar to that of the mechanical-type closing switch and is very useful.

The mechanical-type opening and closing switch is moved up and down to open or close the door window. To close the door window, a driver or a passenger moves his/her finger from the front side toward the rear side with respect to a vehicle running direction to touch the mechanical-type closing switch and pulls up the switch with a ball of his/her finger. To open the door window, the driver or the passenger puts his/her finger on an upper surface of the switch and depresses the switch downwardly.

When a driver or a passenger operates the door window closing switch 70A that is arranged on the rear wall 61 of the switch operation recess 60 according to the first embodiment, he/she puts his/her finger into the switch operation recess 60 and touches the touch-sensitive door window closing switch 70A with his/her finger. This closing operation with the touch-sensitive closing switch 70A is similar to the operation with using the mechanical-type switch and therefore, the driver or the passenger closes the door window 50 with the touch-sensitive closing switch 70A similarly to the closing operation with pulling up the mechanical-type closing switch with a ball of the finger. This is very useful.

As illustrated in FIG. 3A, the rear wall 61 of the switch operation recess 60 has a recessed portion 61A that is recessed toward the vehicular rear side from an inner surface of the rear wall 61. The recessed portion 61A is recessed in a direction along a thickness of the rear wall 61. The door window closing switch 70A is arranged in the recessed portion 61A and the switch surface 701A of the closing switch 70A is recessed from the inner surface of the rear wall 61. Therefore, even if the finger is just put in the switch operation recess 60, the door window 50 is not closed. The driver or the passenger necessarily puts his/her finger (a tip of or a ball of a finger) into the recessed portion 61A and touches the switch surface 701A of the door window closing switch 70A to close the door window 50. Therefore, the door window 50 is less likely to be closed by mistake.

The door window closing switch 70A may have a switch surface 701A area smaller or greater than that of the substantially rectangular shape in FIG. 2 as long as it has a surface area so that the driver or the passenger puts his/her finger into the switch operation recess and smoothly touches the surface 701A without groping. The door window closing switch 70A does not necessarily have a substantially laterally long rectangular shape but may have a substantially circular shape, a substantially square shape, or a substantially vertically long rectangular shape.

The door window opening switch 70B is a switch for opening the door window 50 and is a touch-sensitive sensor made of conductive resin similar to the door window closing switch 70A. The door window opening switch 70B is arranged in the switch mount member 16 so that a switch surface 701B thereof can be touched from the main surface (upper surface) portion 161 side. Specifically, the door window opening switch 70B is mounted on the vehicular rear side with respect to a vehicular rear-side opening edge portion 65E. The door window opening switch 70B has a substantially rectangular shape elongated in the vehicular width direction and is arranged such that a long side thereof is substantially parallel to the rear-side opening edge portion 65E. The door window opening switch 70B may not necessarily have a substantially rectangular shape elongated in the vehicular width direction but may have a substantially circular shape, a substantially square shape, or a substantially rectangular shape elongated in the vehicular front-and-rear direction.

As illustrated in FIG. 3A, the door window opening switch 70B is arranged in the switch mount member 16 such that the surface 701B thereof is located lower than the surface of the main surface (upper surface) portion 161. In the configuration in which the opening switch 70B is arranged below the surface of the main surface (upper surface) portion 161 of the switch mount member 16, the passenger or the driver necessarily and intentionally depresses his/her finger that is put around the opening switch 70B into the recessed portion of the switch mount member 16 to touch the switch surface 701B of the opening switch 70B and open the door window 50. Accordingly, the door window 50 is less likely to be opened unintentionally and such a wrong operation is less likely to occur.

In the configuration in which the opening switch 70B is arranged below the surface of the main surface (upper surface) portion 161 of the switch mount member 16, the driver or the passenger intentionally depresses his/her finger that is put around the opening switch 70B into the recessed portion of the switch mount member 16 to touch the switch surface 701B of the opening switch 70B and open the door window 50. Such an operation of opening the door window 50 is similar to the operation of opening the door window by putting on a finger on the mechanical-type switch and depressing the switch downwardly. Accordingly, the door window 50 is easily opened and it is very useful.

Next, a configuration of the side walls 60A included in the switch operation recess 60 will be described with reference to FIG. 3A. The rear wall 61 that is on the vehicular rear side among the side walls 60A is slanted such that a portion thereof near the bottom portion 60B is closer to the vehicular rear side than a portion thereof near the rear-side opening edge portion 65E. Namely, the rear wall 61 is slanted toward the vehicular rear side as it extends from the rear-side opening edge portion 65E toward the bottom portion 60B. At least a portion of the rear wall 61 corresponding to a range from the rear-side opening edge portion 65E to the door window closing switch 70A is slanted or extends rearward. Therefore, a portion of the rear wall 61 that is lower than the recessed portion 61A is not necessarily slanted toward the vehicular rear side but may be vertically straight. Namely, the rear wall 61 may have any configuration as long as the door window closing switch 70A is located on the vehicular rear side with respect to the rear-side opening edge portion 65E. With such a configuration, when the driver or the passenger puts his/her finger into the switch operation recess 60, he/she flexes his/her finger along a surface of the switch mount member 16 from the main surface (upper surface) portion 161 to the rear wall 61 of the switch operation recess 60, namely, flexes his/her finger to hold the rear-side opening edge portion 65E. Accordingly, the driver or the passenger touches the door window closing switch 70A arranged on the slanted rear wall 61 with his/her finger tip. Thus, the door window 50 is closed. The passenger or the driver necessarily flexes his/her finger along the surface of the rear-side opening edge portion 65E and the rear wall 61 to touch the closing switch 70A with his/her finger and close the door window 50. Therefore, even if the driver or the passenger puts his/her arm or hand on the switch mount member 16 and puts his/her finger into the switch operation recess 60 with a natural shape of the finger, he/she may not touch the door window closing switch 70A easily. Therefore, the door window 50 is less likely to be closed unintentionally or by mistake.

Figure 5:
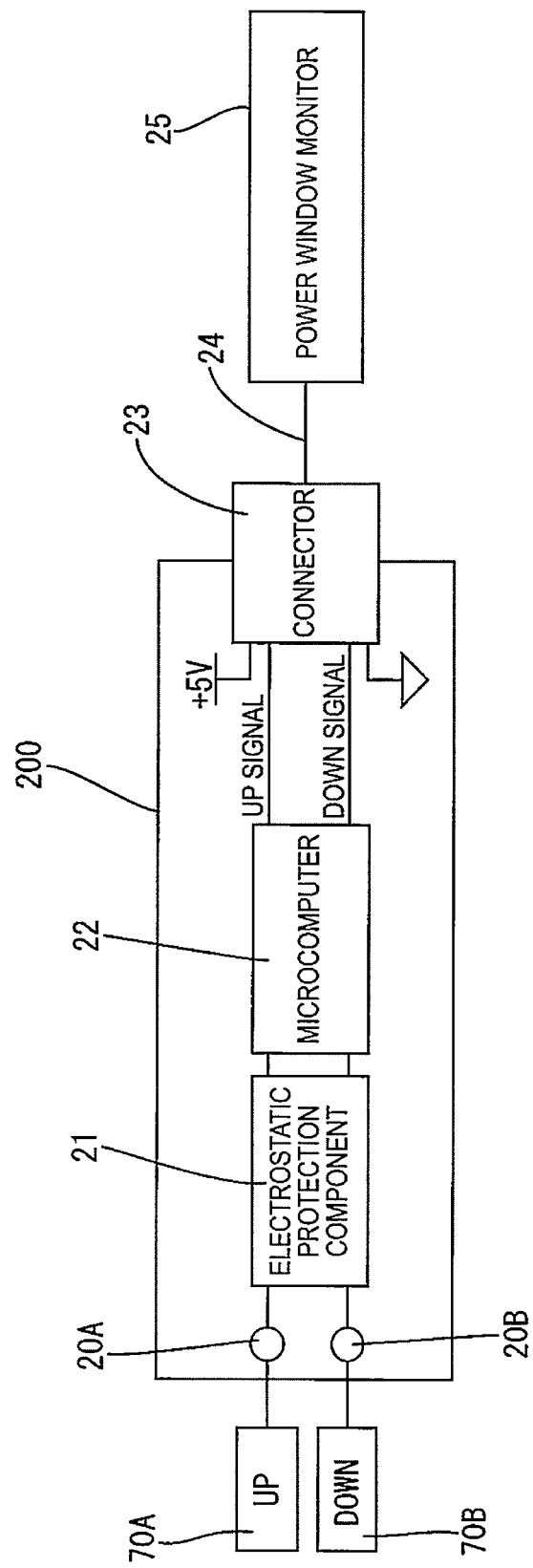
FIG. 5 is a block diagram illustrating a control circuit for opening and closing a door window.

Control of closing and opening the door window 50 according to the first embodiment will be described with reference to FIGS. 4 and 5. FIG. 4 is a rear view of the switch mount member 16 in FIG. 2, and FIG. 5 is a block diagram of a control circuit related to the closing and opening of the door window 50. If a driver or a passenger touches the door window closing switch 70A with his/her finger, an input signal representing that the door window closing switch 70A is touched with the finger is input to a microcomputer 22 via a terminal 20A included in a control device 200. The microcomputer 22 converts the input signal into a door window close signal (UP signal) and the door window close signal (UP signal) is transmitted to a power window motor 25 via a connector 23 and a harness 24. According to the door window close signal (UP signal), the power window motor 25 is activated to close the door window 50. An electrostatic protection component 21 is connected between the terminals 20A, 20B and the microcomputer 22 to protect the microcomputer 22 from static electricity.

Similarly, if a driver or a passenger touches the door window opening switch 70B with his/her finger, an input signal representing that the door window opening switch 70B is touched with the finger is input to the microcomputer 22 via the terminal 20B included in the control device 200. The microcomputer 22 converts the input signal into a door window open signal (DOWN signal) and the door window open signal (DOWN signal) is transmitted to the power window motor 25 via the connector 23 and the harness 24. According to the door window open signal (DOWN signal), the power window motor 25 is activated to open the door window 50.

Second Embodiment

Figure 6A:
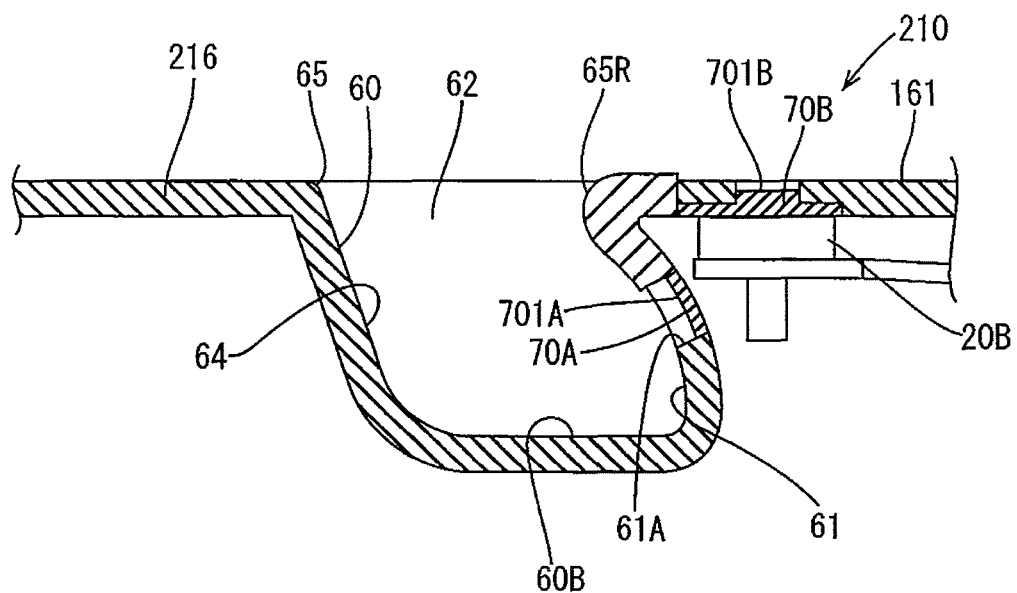
FIG. 6A is a cross-sectional view of a door window opening and closing switch assembly according to a second embodiment.

Next, a door window opening and closing switch assembly 210 according to a second embodiment of the present technology will be described with reference to FIG. 6A. FIG. 6A is a cross sectional view of a switch mount member 216 included in the door window opening and closing assembly 210 according to the second embodiment. Components to which the same numerals or symbols as the first embodiment are applied have configuration similar to that of the first embodiment.

According to the first embodiment, as illustrated in FIG. 3A, the vehicular-rear side opening edge portion 65E has a surface that is continuous smoothly from the surface of the main surface (upper surface) portion 161 of the switch mount member 16 to the surface of the rear wall 61 of the switch operation recess 60. According to the first embodiment, the front wall 64, the vehicular interior side wall 63, the vehicular exterior side wall 62, the rear wall 61, and the bottom portion 60B have a substantially same thickness as the main surface portion 161 of the switch mount member 16. According to the second embodiment, as illustrated in FIG. 6A, a vehicular-rear side opening edge portion has a raised shape. A raised portion 65R is provided at the vehicular-rear side opening edge portion that is between the main surface (upper surface) portion 161 of the switch mount member 216 and the rear wall 61. The raised portion 65R has a thickness greater than that of the main surface portion 161 and the rear wall 61.

For example, the raised portion 65R may be molded integrally with the main surface portion 161 and the rear wall 61 as a unitary component of the switch mount member 216 such that the thickness of the raised portion 65R is greater than that of portions of the switch mount member 216 other than the raised portion 65R. The raised portion 65R may be molded as an integral part of the switch mount member 216 so that the raised portion 65R has a thickness greater than that of the main surface portion 161, the front wall 64, the vehicular interior side wall 63, the vehicular exterior side wall 62, the bottom portion 60B and a portion of the rear wall 61 lower than the recessed portion 61A. Thus, the raised portion 65R is easily formed The raised portion may be provided as a separate component from the side walls and the main surface portion. According to such a configuration, the raised portion may be made of a material different from that of the side wall and the main surface portion or may have any shape. For example, the raised portion 65R formed of a rubber member or a thick member with embossed effect may be provided between the vehicular rear side portion of the main surface portion 161 of the switch mount member 216 and the rear wall 61. Further, the curved opening edge portion 65E, which is illustrated in FIGS. 3A and 3B, may be covered with a rubber member or a member with embossed effect to form the raised portion 65R.

The raised portion 65R is provided at the vehicular rear side opening edge portion of the opening edge portion 65. Therefore, a driver or a passenger necessarily moves his/her finger over the raised portion 65R formed at the rear-side opening edge portion intentionally and insert the finger into the switch operation recess 60 through the opening thereof that is located on the front-side with respect to the raised portion 65R. Further, the driver or the passenger flexes his/her finger to touch the door window closing switch 70A to close the door window. Accordingly, wrong operations are less likely to occur. The finger is less likely to be inserted in the switch operation recess 60 by accident when the driver or the passenger just puts his/her arm or hand on the switch mount member 16. Therefore, the door window closing switch 70A is not touched easily and the raised portion 65R functions as a stopper.

Figure 6B:
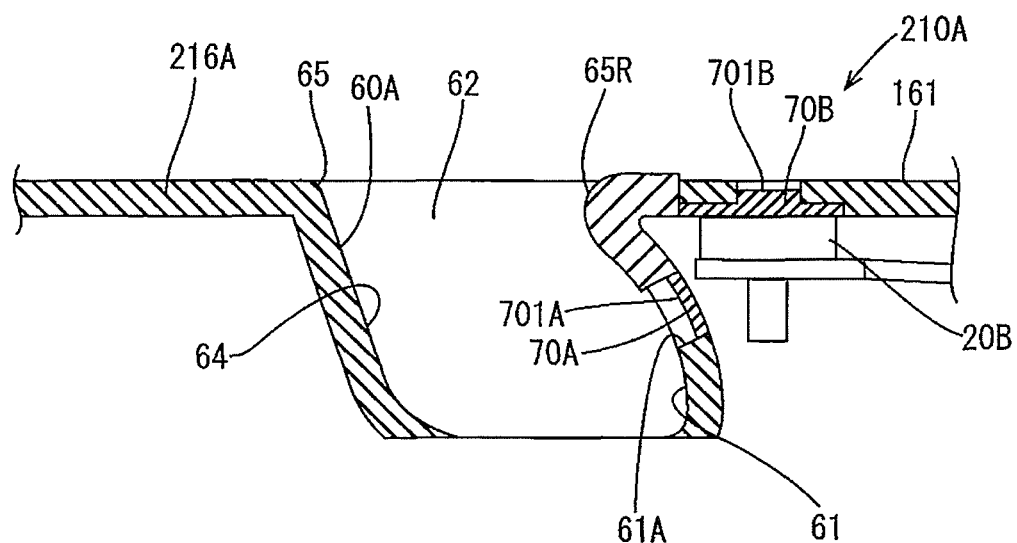
FIG. 6B is a cross-sectional view of a door window opening and closing switch assembly according to a modification of the second embodiment.

The switch operation recess 60 may not include the bottom portion 60B and the switch operation recess 60 may be formed in a through hole. As illustrated in FIG. 6B, according to a modification of the second embodiment, a window opening and closing switch assembly 210A includes a switch mount member 216A that has the switch operation through hole 60A instead of the switch operation recess 60. According to such a configuration, a person with long nails can easily operate the switch. Further, a space below the switch operation through hole 60A may be used freely and this provides free design choice. In this modification, the configuration of the window opening and closing switch assembly 210A differs from that of the second embodiment in that the switch operation through hole 60A is formed instead of the switch operation recess 60, and other configurations are same as those in the second embodiment.

Other Embodiments

The present technology is not limited to the description as described above with reference to the drawings. For example, the present technology may include following embodiments.

(1) In the above embodiments, only one door window opening and closing assembly is mounted in the switch mount member. However, for example, door window opening and closing assemblies may be mounted in a switch mount member included in a vehicular interior part on a driver's side so that a driver opens and closes a plurality of door windows. The number of door window opening and closing assemblies may correspond to the number of door windows.

(2) In the above embodiments, the door window closing switch is mounted on the rear wall included in the side walls of the switch operation recess. However, the door window closing switch may be arranged on other side walls such as the vehicular interior side wall or the vehicular exterior side wall.

(3) In the above embodiments, the switch mount member includes the main surface portion that is horizontal (substantially vertical with respect to a surface of the vehicular interior part). However, because of a design of the vehicular interior part, the main surface portion may be slanted upwardly toward the vehicular front side or slanted downwardly toward the vehicular interior side.

The invention claimed is:
1. A door window opening and closing switch assembly comprising:
   a vehicular door window closing switch that is a touch-sensitive sensor and for closing a vehicular door window; and
   a switch mount member where the vehicular door window closing switch is mounted, the switch mount member including:
      a switch operation portion having an opening, an opening edge portion around the opening, and a side wall extending from the opening edge portion, wherein the door window closing switch is mounted on the side wall,
   wherein
      the side wall includes a rear wall that is located on a vehicular rear side, and
      the door window closing switch is mounted on the rear wall,
   wherein
      the rear wall includes a portion ranging from the opening edge portion on the vehicular rear side to the door window closing switch and the portion is slanted toward the vehicular rear side as is away from the opening edge portion.
2. A door window opening and closing switch assembly comprising:
   a vehicular door window closing switch that is a touch-sensitive sensor and for closing a vehicular door window; and a switch mount member where the vehicular door window closing switch is mounted, the switch mount member including:
a switch operation portion having an opening, an opening edge portion around the opening, and side walls extending downward from the opening edge portion, the side walls being opposite each other, wherein
the door window closing switch is mounted on one of the side walls; and
a door window opening switch that is a touch-sensitive sensor having a switch surface and for opening the vehicular door window, wherein
the switch mount member further includes a main surface portion, and
the door window opening switch is mounted in the main surface portion such that the switch surface thereof is uncovered and recessed from a surface of the main surface portion.

3. A door window opening and closing switch assembly comprising:
a vehicular door window closing switch that is a touch-sensitive sensor and for closing a vehicular door window; and
a switch mount member where the vehicular door window closing switch is mounted, the switch mount member including:
a switch operation portion having an opening, an opening edge portion around the opening, and side walls extending downward from the opening edge portion, the side walls being opposite each other, wherein
the door window closing switch is mounted on one of the side walls, and
wherein
the one of the side walls has a recessed portion and the door window closing switch is arranged in the recessed portion, and
the door window closing switch has a switch surface that is recessed from an inner surface of the one of the side walls.

4. A door window opening and closing switch assembly comprising:
a vehicular door window closing switch that is a touch-sensitive sensor and for closing a vehicular door window; and
a switch mount member where the vehicular door window closing switch is mounted, the switch mount member including:
a switch operation portion having an opening, an opening edge portion around the opening, and side walls extending downward from the opening edge portion, the side walls being opposite each other, wherein
the door window closing switch is mounted on one of the side walls,
wherein
the one of the side walls includes a rear wall that is located on a vehicular rear side,
the door window closing switch is mounted on the rear wall, and
the rear wall extends from the opening edge portion on the vehicular rear side and the door window closing switch is located more to the vehicular rear side than the opening edge portion on the vehicular rear side is.

5. A door window opening and closing switch assembly comprising:
a vehicular door window closing switch that is a touch-sensitive sensor and for closing a vehicular door window; and
a switch mount member where the vehicular door window closing switch is mounted, the switch mount member including:
a switch operation portion having an opening, an opening edge portion around the opening, and side walls extending downward from the opening edge portion, the side walls being opposite each other, wherein
the door window closing switch is mounted within a recessed portion provided in one of the side walls.

6. The door window opening and closing switch assembly according to claim 5, wherein
the one of the side walls includes a rear wall that is located on a vehicular rear side, and
the door window closing switch is mounted on the rear wall.

7. The door window opening and closing switch assembly according to claim 5, wherein
the switch mount member further includes a main surface portion and a bottom portion,
the switch operation portion is provided in the main surface portion and the bottom portion is provided at an end of the side walls opposite to the opening edge portion, and
the switch operation portion is a recess that is defined by the side walls and the bottom portion.

8. The door window opening and closing switch assembly according to claim 5, wherein
the switch mount member further includes a main surface portion, and
the switch operation portion is a through hole that is defined in the main surface portion by the opening and the side walls extending from the opening edge portion.

9. The door window opening and closing switch assembly according to claim 5, wherein, when a switch surface of the door window closing switch is untouched, the switch surface is spaced downwardly from the opening of the switch operation portion.

10. The door window opening and closing switch assembly according to claim 5, wherein
the opening edge portion on the vehicular rear side includes a raised portion.

11. The door window opening and closing switch assembly according to claim 10, wherein
the raised portion is integrally molded with the switch mount member as a unitary part.

12. The door window opening and closing switch assembly according to claim 10, wherein
the switch mount member further includes a main surface portion where the switch operation portion is provided, and
the raised portion has a thickness greater than that of the side wall and the main surface portion.

13. The door window opening and closing switch assembly according to claim 10, wherein the raised portion is arranged at the opening edge portion on the vehicular rear side as a separate component from each of the side walls and the main surface portion.

* * * * *